US010429050B2

(12) United States Patent
Fukasawa

(10) Patent No.: US 10,429,050 B2
(45) Date of Patent: Oct. 1, 2019

(54) LIGHT-EMITTING APPARATUS HAVING DIFFERENT PACKAGING DENSITIES

(71) Applicants: CITIZEN ELECTRONICS CO., LTD., Fujiyoshida-shi, Yamanashi (JP); CITIZEN HOLDINGS CO., LTD., Tokyo (JP)

(72) Inventor: Koichi Fukasawa, Kofu (JP)

(73) Assignees: Citizen Electronics Co., Ltd., Yamanashi (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 15/226,303

(22) Filed: Aug. 2, 2016

(65) Prior Publication Data

US 2017/0038051 A1 Feb. 9, 2017

(30) Foreign Application Priority Data

Aug. 3, 2015 (JP) ................................ 2015-153403

(51) Int. Cl.
*F21V 29/503* (2015.01)
*H01L 25/075* (2006.01)
(Continued)

(52) U.S. Cl.
CPC .............. *F21V 29/503* (2015.01); *F21V 3/02* (2013.01); *H01L 25/0753* (2013.01); (Continued)

(58) Field of Classification Search
CPC ............. F21Y 2105/00; F21Y 2105/12; F21Y 2105/10; H05B 33/12; H05B 33/14; H05B 33/145; F21V 29/503
See application file for complete search history.

(56) References Cited

U.S. PATENT DOCUMENTS 8,632,226 B2 * 1/2014 Hata ....................... F21V 11/06
362/249.02
9,243,791 B2 * 1/2016 Agatani .............. H01L 25/0753
(Continued)

FOREIGN PATENT DOCUMENTS

JP 2001356720 A 12/2001
JP 2005159262 A 6/2005
(Continued)

OTHER PUBLICATIONS

Japanese Notice of Reasons for Refusal for Japanese Application No. 2015-153403, dated Apr. 22, 2019 with translation, 8 pages.

*Primary Examiner* — Anh T Mai
*Assistant Examiner* — Michael Chiang
(74) *Attorney, Agent, or Firm* — RatnerPrestia

(57) ABSTRACT

A light-emitting apparatus according to the present invention has a packaging substrate having a packaging area, a plurality of light-emitting elements packaged in the packaging area, and a sealing resin that seals the plurality of light-emitting elements. The plurality of light-emitting elements includes light-emitting elements packaged in a first packaging area including the center of the packaging area and light-emitting elements packaged in a second packaging area surrounding the perimeter of the first packaging area. The packaging density of the light-emitting elements packaged in the first packaging area is higher than the packaging density of the light-emitting elements packaged in the second packaging area.

4 Claims, 14 Drawing Sheets

(51) Int. Cl.

| | |
|---|---|
| ***F21V 3/02*** | (2006.01) |
| ***H01L 33/50*** | (2010.01) |
| ***H01L 33/64*** | (2010.01) |
| *H01L 33/56* | (2010.01) |
| *H01L 33/62* | (2010.01) |
| *F21Y 115/10* | (2016.01) |
| *F21Y 105/12* | (2016.01) |

(52) U.S. Cl.

CPC .......... *H01L 33/504* (2013.01); *H01L 33/641* (2013.01); *F21Y 2105/12* (2016.08); *F21Y 2115/10* (2016.08); *H01L 33/56* (2013.01); *H01L 33/62* (2013.01); *H01L 2224/48091* (2013.01); *H01L 2224/48137* (2013.01)

(56) References Cited

U.S. PATENT DOCUMENTS

| | | | | |
|---|---|---|---|---|
| 2010/0244061 | A1* | 9/2010 | Shirakawa | F21K 9/00 257/89 |
| 2012/0106155 | A1 | 5/2012 | Hata et al. | |
| 2013/0032820 | A1 | 2/2013 | Wirth | |
| 2013/0106276 | A1* | 5/2013 | Miyairi | H01L 25/0753 313/498 |
| 2013/0141891 | A1* | 6/2013 | Funakubo | F21V 21/00 362/84 |
| 2013/0320361 | A1* | 12/2013 | Huang | H01L 33/08 257/88 |
| 2014/0084809 | A1 | 3/2014 | Catalano | |
| 2014/0085884 | A1* | 3/2014 | Horio | H01L 25/0753 362/235 |
| 2014/0183574 | A1* | 7/2014 | Nakabayashi | H01L 33/62 257/88 |
| 2015/0146427 | A1* | 5/2015 | Tsuchiya | F21V 23/001 362/249.06 |

FOREIGN PATENT DOCUMENTS

| | | | |
|---|---|---|---|
| JP | 2010015700 | A | 1/2010 |
| JP | 2010049865 | A | 3/2010 |
| JP | 2011-114094 | A | 6/2011 |
| JP | 2012504342 | A | 2/2012 |
| JP | 2012094401 | A | 5/2012 |
| JP | 2013526016 | A | 6/2013 |
| JP | 2013137986 | A | 7/2013 |
| WO | 2010036730 | A1 | 4/2010 |

* cited by examiner

LIGHT-EMITTING APPARATUS HAVING DIFFERENT PACKAGING DENSITIES

TECHNICAL FIELD

The present invention relates to a light-emitting apparatus.

BACKGROUND ART

A light-emitting apparatus which is referred to as a COB (Chip On Board) is known, in which a light-emitting element including an LED (light-emitting diode) element is packaged on a general-purpose substrate including a ceramic substrate and a metal substrate. The light-emitting apparatus obtains white light, by sealing an LED element that emits blue light with a resin containing phosphors and mixing light obtained by exciting the phosphors by the light from the LED element. Further, it is known to collect emitted light by mounting an optical element including a lens, on a light-emitting apparatus in which a light-emitting element including an LED element, is packaged.

Patent Document 1 describes arrangement of a lens on a light-emitting apparatus including a plurality of light-emitting elements packaged on the surface of a packaging substrate and a wavelength conversion unit configured to wavelength-convert light irradiated from the light-emitting element. The light-emitting apparatus described in Patent Document 1 forms an illuminator from the light-emitting apparatus and the lens by arranging the lens on the light-emitting apparatus in order to function as a light distribution unit configured to control the distribution of light irradiated from the light-emitting apparatus in a predetermined direction.

RELATED DOCUMENT

[Patent Document 1] Japanese Laid Open Patent Document No. 2011-114094

SUMMARY

The light-emitting apparatus described in Patent Document 1 may be downsized and required light emission intensity for the light-emitting apparatus may be secured, by packaging the plurality of light-emitting elements packaged on the packaging substrate at regular intervals. However, when light-emitting elements are sealed with a sealing resin in which phosphors are dispersed, the temperature of the phosphors may be higher by emitting the light to the phosphors from the light-emitting element, and the light emission intensity of the light-emitting element is reduced by the higher temperature. In particular, if the packaging interval of the light-emitting element is narrowed to increase the packaging density of the light-emitting element in order to increase the light emission intensity, the temperature of the light-emitting element rises by increasing the amount of generated heat of the light-emitting apparatus and the light emission intensity of the light-emitting element may be reduced. On the other hand, when the packaging interval of the light-emitting element is widened in order to suppress the increase in the amount of generated heat of the light-emitting apparatus, the number of light-emitting elements arranged in positions close to the optical axis of the lens decreases and the light emission intensity of the light-emitting apparatus may be reduced.

Therefore, an object of the present invention is to provide a light-emitting apparatus having high light-emission intensity and capable of suppressing an increase in the amount of generated heat.

In order to achieve the above-described object, the light-emitting apparatus according to the present invention has a packaging substrate having a packaging area, a plurality of light-emitting elements packaged in the packaging area, and a sealing resin that seals the plurality of light-emitting elements, and the plurality of light-emitting elements includes light-emitting elements packaged in a first packaging area including the center of the packaging area and light-emitting elements packaged in a second packaging area surrounding the perimeter of the first packaging area, and the packaging density of the light-emitting elements packaged in the first packaging area is higher than the packaging density of the light-emitting elements packaged in the second packaging area.

Further, in the light-emitting apparatus according to the present invention, it is preferable that each of the light-emitting elements packaged in the first packaging area is arranged in the form of a lattice so that the interval between the light-emitting elements adjacent to each other is a first interval, and each of the light-emitting elements packaged in the second packaging area is arranged so that the interval between the light-emitting elements adjacent to each other is a second interval wider than the first interval.

Further, in the light-emitting apparatus according to the present invention, it is preferable that the packaging substrate is a metal substrate.

Further, it is preferable that the light-emitting apparatus according to the present invention further has an optical element that is placed on the packaging substrate so as to cover the sealing resin and which collects light emitted from a plurality of light-emitting elements.

According to the present invention, a light-emitting apparatus having a high light-emission intensity and capable of suppressing an increase in the amount of generated heat is provided.

DESCRIPTION OF EMBODIMENTS

Hereinafter, with reference to the drawings, a light-emitting apparatus is explained. However, it should be understood that the present invention is not limited to the drawings or embodiments described below.

Outline of Light-Emitting Apparatus According to Embodiment

In a light-emitting apparatus according to an embodiment, a plurality of light-emitting elements is arranged by being divided into light-emitting elements packaged densely in a first packaging area including the center of a packaging area and light-emitting elements packaged less densely than the light-emitting elements in the first packaging area in a second packaging area surrounding the perimeter of the first packaging area. Since in the light-emitting apparatus according to the embodiment, the light-emitting elements are densely arranged at the center of the packaging area and the light-emitting elements comparatively less densely arranged in positions distant from the center, coexistence of a high light-emission intensity and suppression of the amount of generated heat is implemented.

Configuration of Light-Emitting Apparatus According to Embodiment

Figure 1A:
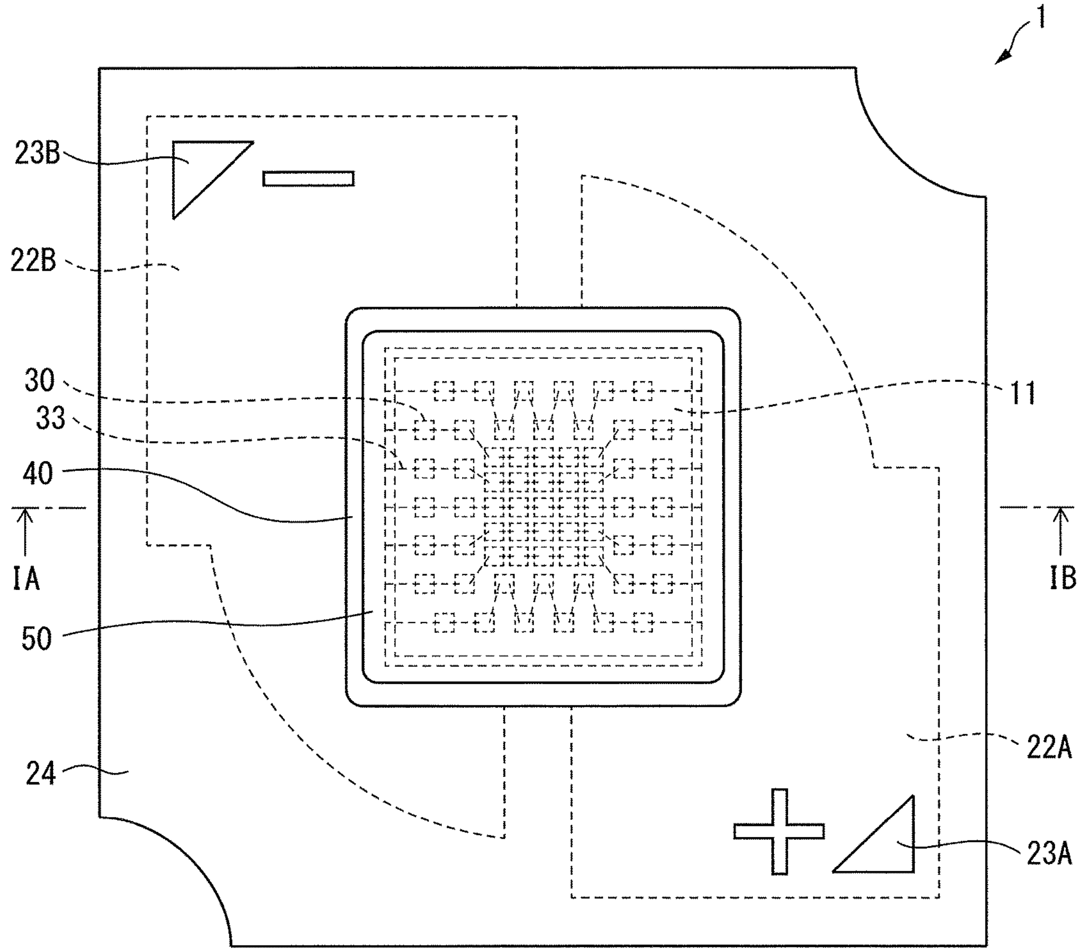
FIG. 1A is a plan view of a light-emitting apparatus according to an embodiment.
Figure 1B:
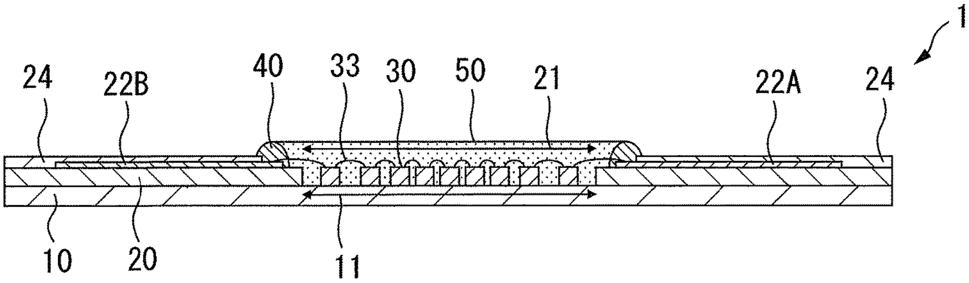
FIG. 1B is a section view of the light-emitting apparatus illustrated in FIG. 1A.

FIG. 1A is a plan view of a light-emitting apparatus according to a first embodiment as a finished product and FIG. 1B is a section view along IA-IB line in FIG. 1A.

A light-emitting apparatus 1 includes a plurality of LED elements as a light-emitting element and is used as various illuminators including an illumination LED and an electric LED bulb. The light-emitting apparatus 1 has a packaging substrate 10, a circuit substrate 20, a plurality of LED elements 30, a resin frame 40 and a sealing resin 50.

The packaging substrate 10 has a shape substantially resembling a square, as an example, and is a metal substrate having a packaging area 11 in which the LED elements are packaged at the center of the top surface thereof. Further, the packaging substrate 10 functions as a heat dissipating substrate for dissipating heat generated by the LED element 30 and phosphor particles, and therefore is configured by, for example, aluminum excellent both in the heat resisting property and in the heat dissipating property. However, the material of the packaging substrate 10 may be another metal, for example, copper or the like as long as it is excellent both in the heat resisting property and in the heat dissipating property.

As an example, the circuit substrate 20 has a shape substantially resembling a square the size of which is the same as that of the packaging substrate 10 and has an opening 21 in a shape substantially resembling a rectangle at the center thereof. The undersurface of the circuit substrate 20 is bonded and fixed onto the packaging substrate 10 with, for example, an adhesive sheet. On the top surface of the circuit substrate 20, a positive electrode side wire pattern 22A and a negative electrode side wire pattern 22B are formed. In two corners located diagonally on the top surface of the circuit substrate 20, a connection electrode 23A and a connection electrode 23B for connecting the light-emitting apparatus 1 to an external power source are formed, respectively. The connection electrode 23A is a positive electrode, i.e., an anode and the connection electrode 23B is a negative electrode, i.e., a cathode. The light-emitting apparatus 1 emits light by the connection electrodes 23A and 23B being connected to an external power source, not illustrated, and a voltage being applied thereto. Further, a white resist 24 is formed on the top surface of the circuit substrate 20, so as to cover the wire patterns 22A and 22B, except for the outer circumferential portion of the opening 21 and the portions of the connection electrodes 23A and 23B.

The LED element 30 is an example of the light-emitting element and is, for example, a blue LED in a shape substantially resembling a square that emits blue light the light emission wavelength band of which is about 450 to 460 nm. The undersurface of the LED element 30 is fixed onto the top surface of the packaging area 11 with a transparent, insulating adhesive or the like. Further, the LED element 30 has a pair of element electrodes on its top surface and as illustrated in FIG. 1A, the element electrodes of the LED elements 30 adjacent to each other are electrically connected to each other with a wire 33. The wire 33 that comes out of the LED element 30 located on the outer circumferential side of the opening 21 is connected to the wire patterns 22A and 22B of the circuit substrate 20. A current is supplied to each LED element 30 via the wire 33.

Figure 2:
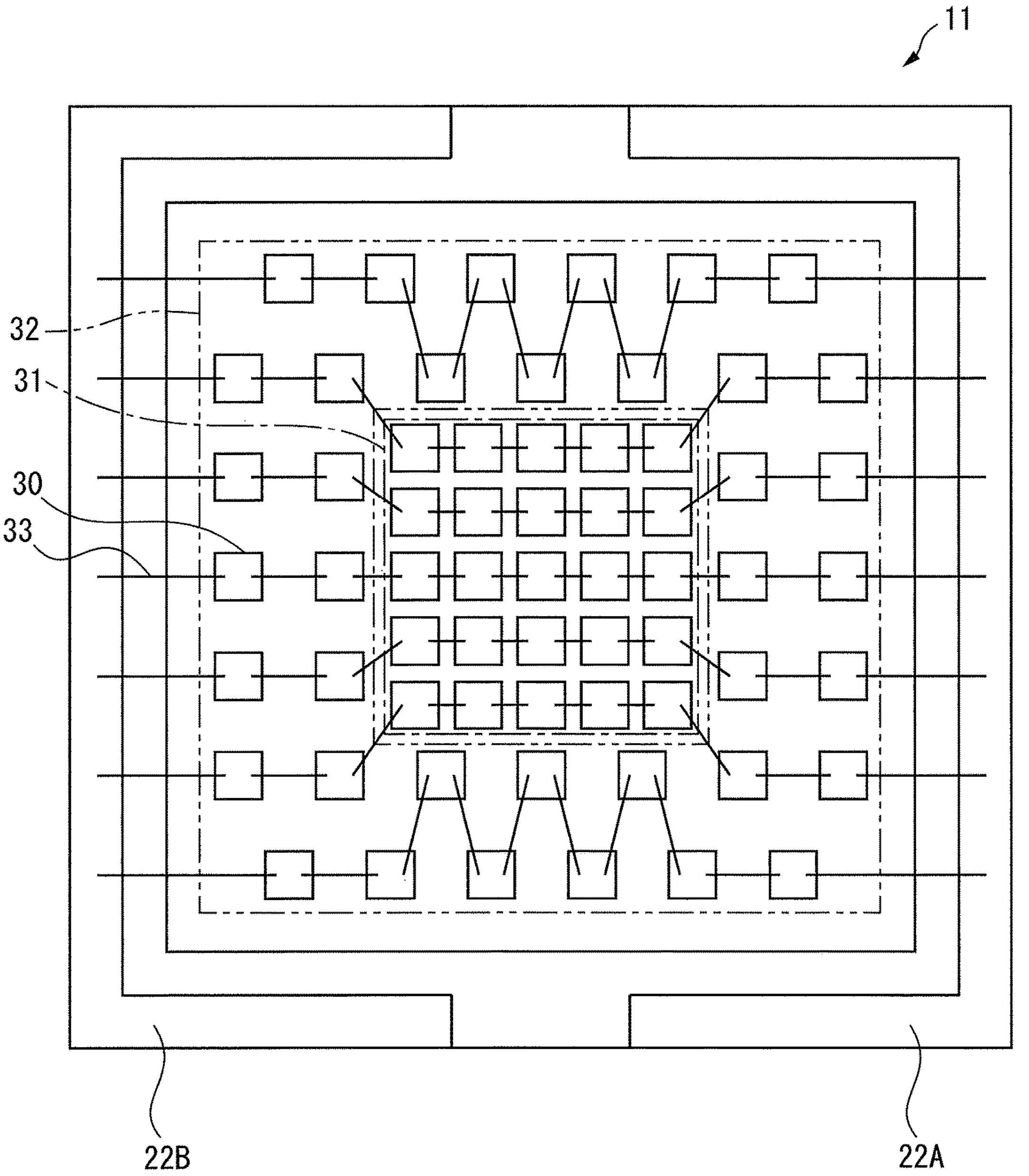
FIG. 2 is an enlarged plan view of the light-emitting apparatus illustrated in FIGS. 1A and 1B.

FIG. 2 is a partially enlarged plan view of the packaging area 11 of the light-emitting apparatus 1.

In the light-emitting apparatus 1, the plurality of LED elements 30 is packaged in the packaging area 11 by being divided into the LED elements 30 packaged in a first packaging area 31 indicated by a one-dot chain line in FIG. 2 and the LED elements 30 packaged in a second packaging area 32 indicated by a two-dot chain line in FIG. 2.

The LED elements 30 packaged in the first packaging area 31 are packaged by being arranged in order in the form of a lattice at regular intervals in the area including the center of the packaging area 11. In the first packaging area 31, the 25 LED elements 30 are packaged. A first packaging interval that is the interval between the LED elements 30 package in the first packaging area 31 is narrower than 0.25 times the length of one side of the LED element 30.

The LED elements 30 packaged in the second packaging area 32 are packaged on the outer edge of the packaging area 11 so as to surround the perimeter of the first packaging area 31. The LED elements 30 packaged in the second packaging area 32 are packaged so that at least one of a packaging interval between the LED elements 30 adjacent to each other in the vertical direction and a packaging interval between the LED elements 30 adjacent to each other in the horizontal direction is the regular interval. In the second packaging area 32, the 38 LED elements 30 are packaged. A second packaging interval, which is the minimum interval between the LED elements 30 packaged in the second packaging area 32, is wider than 0.25 times the length of one side of the LED element 30. In other words, the second packaging interval between the LED elements 30 packaged in the second packaging area 32 is wider than the first packaging interval between the LED elements 30 packaged in the first packaging area 31.

The resin frame 40 is a frame body in a shape substantially resembling a rectangle configured by, for example, a white resin in accordance with the size of the opening 21 of the circuit substrate 20 and is fixed onto the outer circumferential portion of the opening 21 on the top surface of the circuit substrate 20. The resin frame 40 is a dam material for preventing the outflow of the sealing resin 50 and reflects light emitted laterally from the LED element 30 toward above the light-emitting apparatus 1 (on the opposite side of the packaging substrate 10 when viewed from the LED element 30).

The sealing resin 50 is injected into the opening 21 and protects and seals the plurality of LED elements 30 and the wire 33 as an integrated single unit. For example, as the sealing resin 50, a colorless, transparent resin including an epoxy resin or a silicone resin, in particular, a resin having a heat resisting property of about 250° C. may be used.

In the sealing resin 50, phosphors including yellow phosphors, are mixed dispersedly. The yellow phosphor is, for example, a phosphor material in the form of a particle including YAG (yttrium aluminum garnet), which absorbs blue light emitted by the LED element 30 and wavelength-converts the blue light into yellow light. The light-emitting apparatus 1 emits white light obtained by mixing blue light from the LED element 30, which is the blue LED, and yellow light obtained by exciting the yellow phosphor with the blue light.

Further, the sealing resin 50 may contain a plurality of kinds of phosphor including the green phosphor and the red phosphor. The green phosphor is, for example, a phosphor material in the form of a particle including $(BaSr)_2SiO_4:Eu^{2+}$, which absorbs blue light emitted by the LED element 30 and wavelength-converts the blue light into green light. The red phosphor is, for example, a phosphor material in the form of a particle including $CaAlSiN_3:Eu^{2+}$, which absorbs blue light emitted by the LED element 30 and wavelength-converts the blue light into red light. The light-emitting apparatus 1 emits white light obtained by mixing blue light from the LED element 30, which is the blue LED, and green light and red light obtained by exciting the green phosphor and the red phosphor with the blue light.

Figure 3:
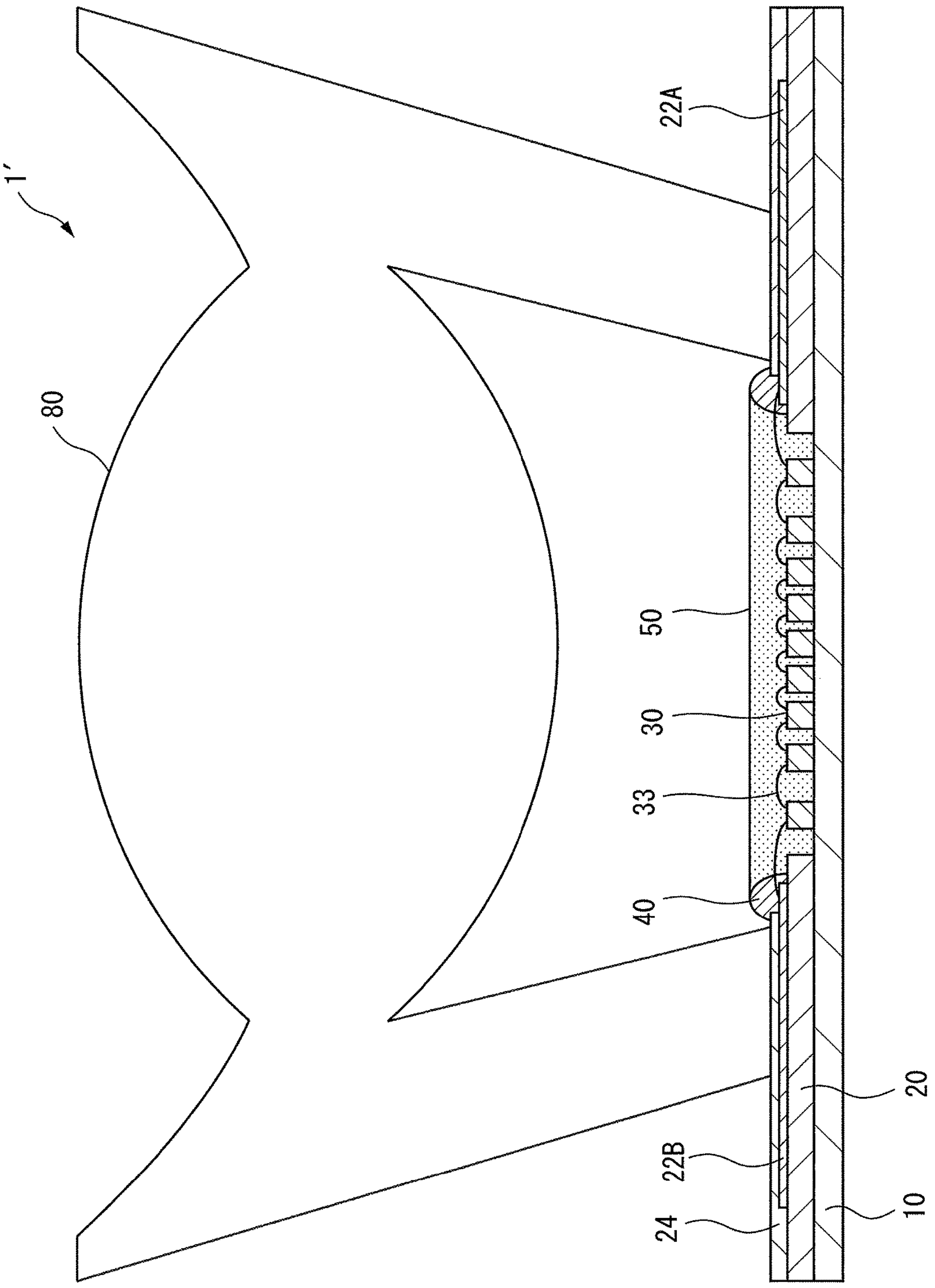
FIG. 3 is a section view of the light-emitting apparatus illustrated in FIGS. 1A and 1B, to which a lens is attached.

FIG. 3 is a side view of a light-emitting apparatus 1' with a lens 80. When the light-emitting apparatus 1 is used as an illuminator, the lens 80 is mounted on the top surface of the circuit substrate 20 so as to, for example, cover the sealing resin 50 as illustrated in FIG. 3. The optical axis of the lens 80 substantially coincides with the center of the packaging area 11. The lens 80 is an example of the optical element and collects light emitted from the plurality of LED elements 30 within the light-emitting apparatus 1 and emits the light toward the above of the light-emitting apparatus 1'. In order to easily mount the lens 80, a planar area may be reserved on which the lens 80 is placed by increasing the area (the amount of space) of the area not covered with the sealing resin 50 on the circuit substrate 20.

Depending on the usage of the light-emitting apparatus 1, the light-emitting apparatus 1 may place an optical element other than the lens 80, for example, a filter or the like on the circuit substrate 20. For example, the plurality of LED elements 30 within the light-emitting apparatus 1 may emit light through an optical element in the shape of a flat plate in place of the lens 80.

Preferably, the packaging interval between the plurality of LED elements 30 packaged in the first packaging area 31 is narrow, since the narrower the packaging interval, the smaller becomes the light-emitting point for the lens 80 to collect light. However, it is necessary to secure a packaging interval of about 5 μm at the minimum for the packaging interval between the plurality of LED elements 30 packaged in the first packaging area 31 in order to, for example, prevent a short circuit from occurring between the LED elements 30 adjacent to each other. Further, if the packaging interval between the LED elements 30 packaged in the first packaging area 31 is too wide, the number of LED elements 30 arranged in positions close to the optical axis of the lens 80 decreases and the intensity of light emitted from the light-emitting apparatus 1' is reduced.

The intervals between the LED elements 30 packaged in the first packaging area 31 and in the second packaging area 32, respectively, are determined by the area of the packaging area 11, the number of packaged LED elements 30 and the optical characteristics of the lens 80. In an example, the first packaging area 31 occupies 30% to 50% of the area of the packaging area 11 and the second packaging area 32 occupies the rest. The packaging interval of the LED elements 30 packaged in the first packaging area 31 is 50 μm at the maximum and the packaging interval of the LED elements 30 packaged in the second packaging area 32 is 200 μm.

Manufacturing Process of Light-Emitting Apparatus According to Embodiment

FIGS. 4 to 7 are diagrams illustrating a manufacturing process of the light-emitting apparatus 1. FIG. 4A is a plan view of a first process, FIG. 5A is a plan view of a second process that follows the first process, FIG. 6A is a plan view of a third process that follows the second process, and FIG. 7A is a plan view of a fourth process that follows the third process. FIG. 4B is a section along IIA-IIB line in FIG. 4A, FIG. 5B is a section along IIIA-IIIB line in FIG. 5A, FIG. 6B is a section along IVA-IVB line in FIG. 6A, and FIG. 7B is a section along VA-VB line in FIG. 7A.

Figure 4A:
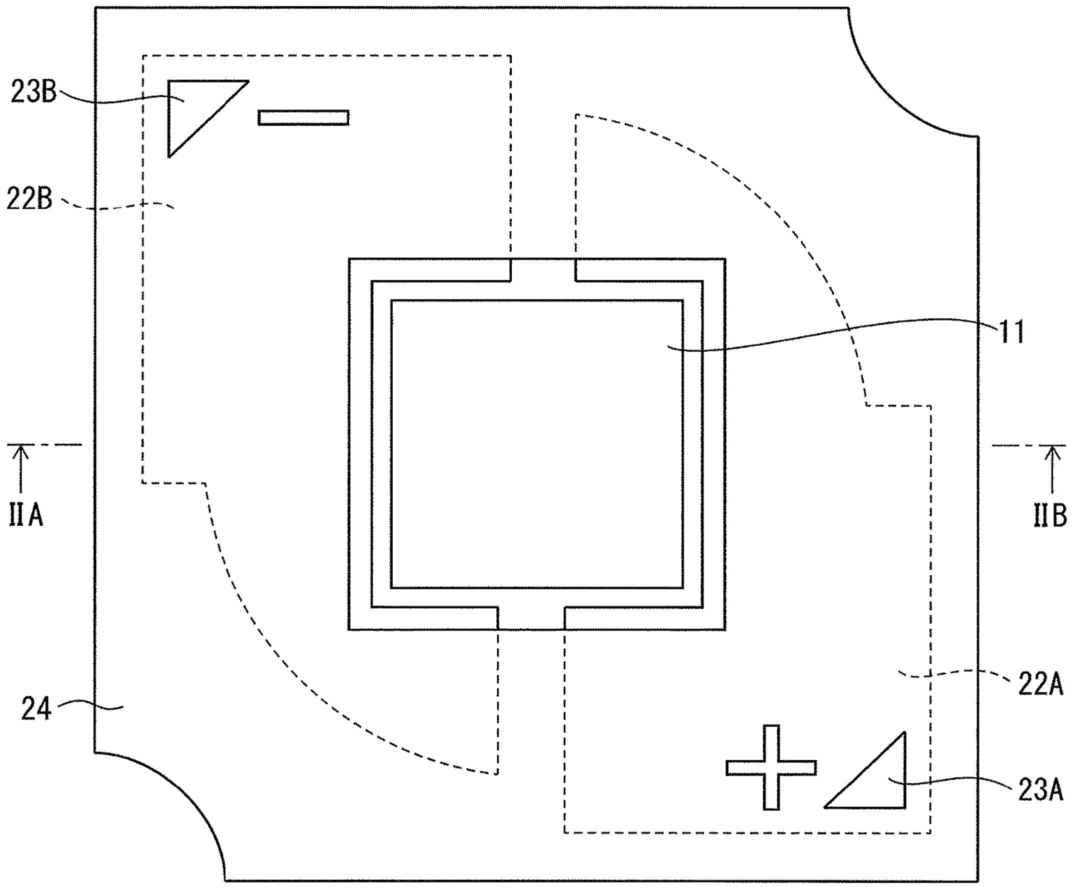
FIG. 4A is a plan view illustrating a first manufacturing process of the light-emitting apparatus illustrated in FIG. 1A and FIG.
Figure 4B:
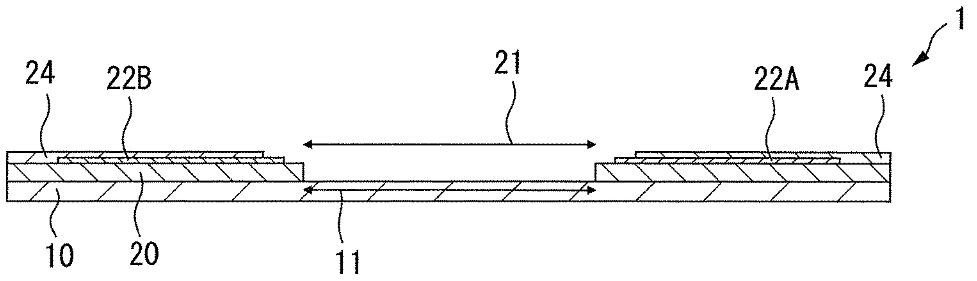
FIG. 4B is a section view corresponding to FIG. 4A.
Figure 5A:
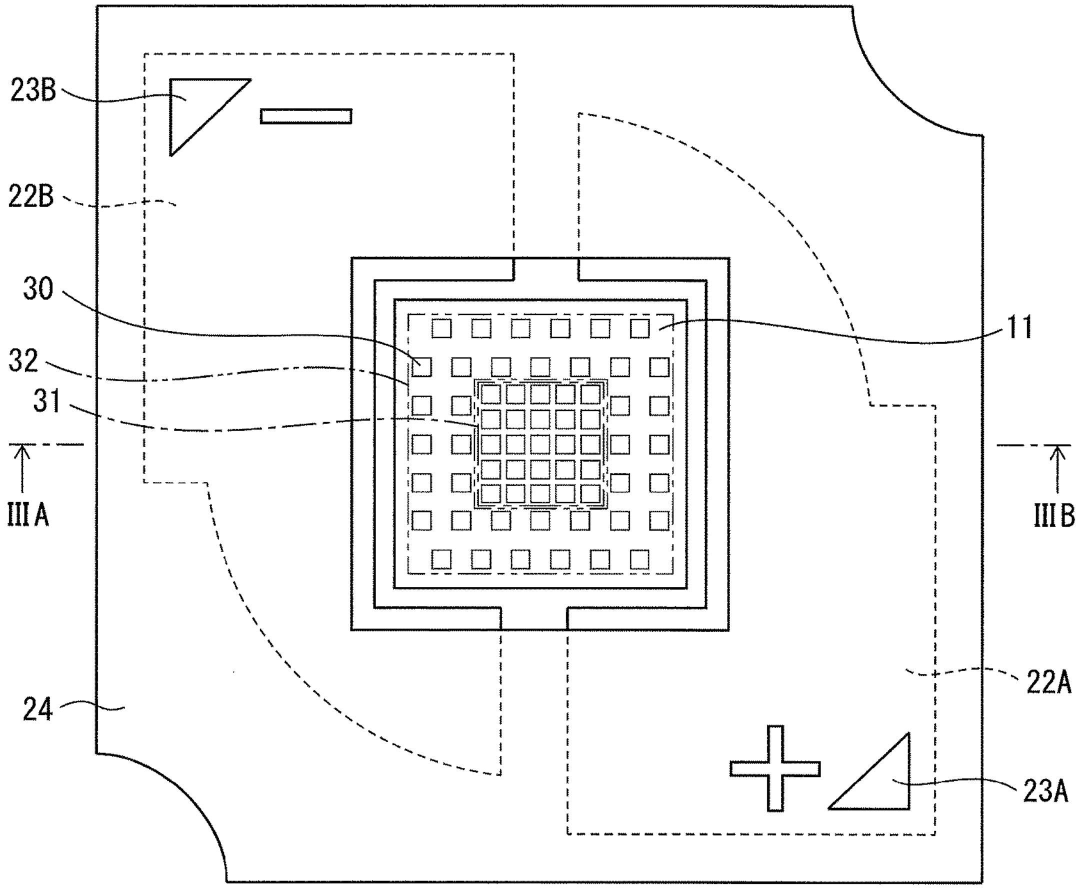
FIG. 5A is a plan view illustrating a second manufacturing process of the light-emitting apparatus illustrated in FIG. 1A and FIG.
Figure 5B:
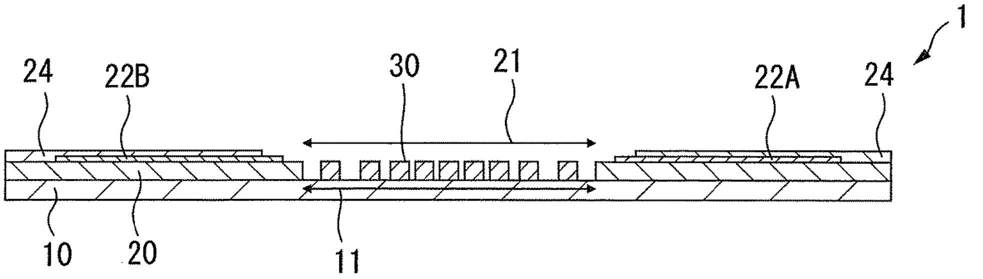
FIG. 5B is a section view corresponding to FIG. 5A.
Figure 6A:
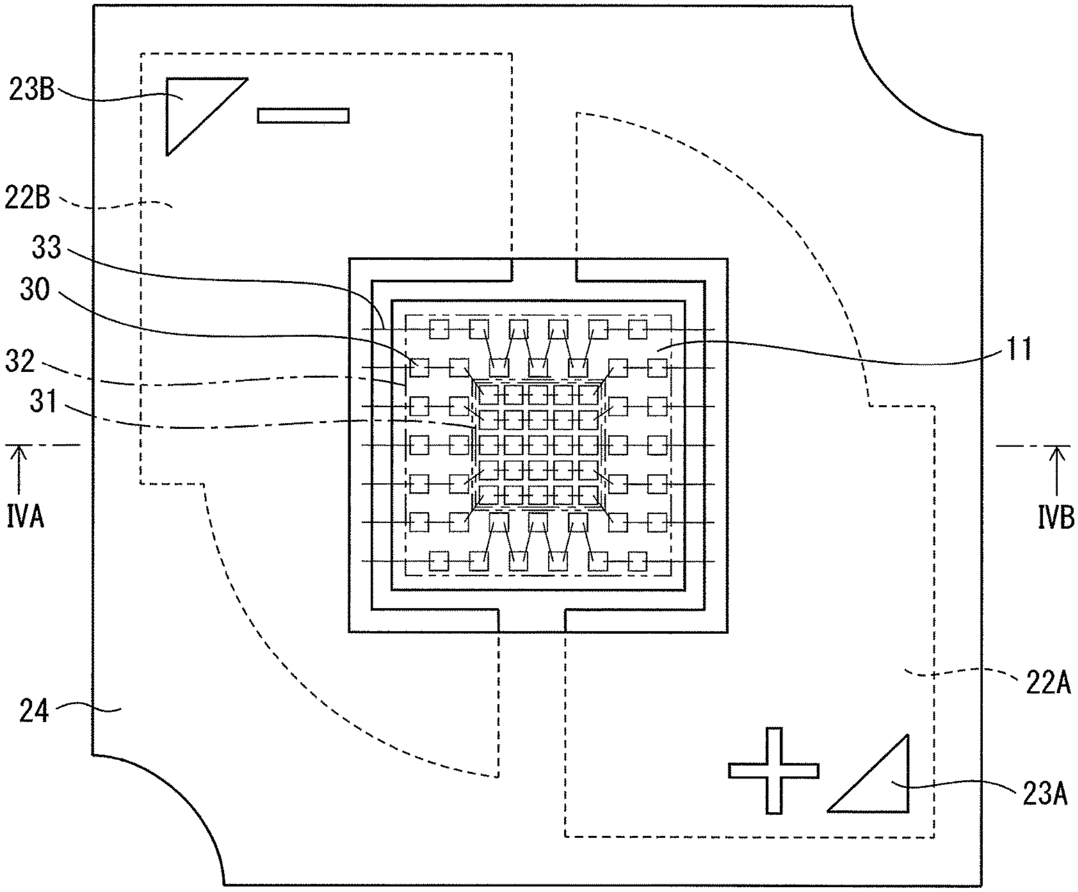
FIG. 6A is a plan view illustrating a third manufacturing process of the light-emitting apparatus illustrated in FIG. 1A and FIG.
Figure 6B:
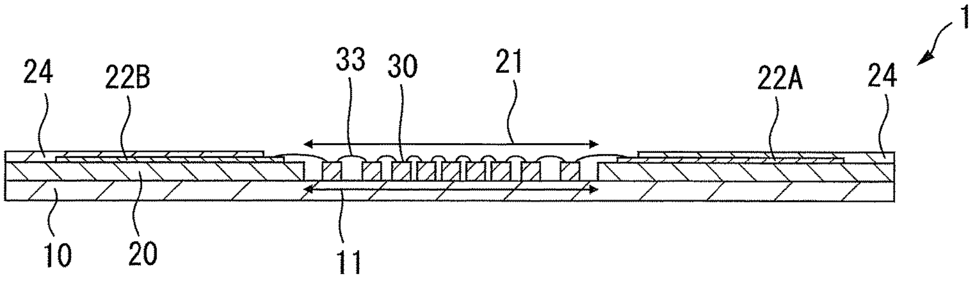
FIG. 6B is a section view corresponding to FIG. 6A.

At the time of manufacturing the light-emitting apparatus 1, first, as illustrated in FIGS. 4A and 4B, the packaging substrate 10 and the circuit substrate 20 having the opening 21 are overlapped and bonded to each other. Next, as illustrated in FIGS. 5A and 5B, the 63 LED elements 30 are packaged. The 25 LED elements 30 are packaged in the form of a lattice in the first packaging area 31 in the vicinity of the center of the packaging area 11 and the remaining 38 LED elements 30 are packaged in the second packaging area 32 surrounding the perimeter of the first packaging area 31. The second packaging interval between the LED elements 30 packaged in the second packaging area 32 is wider than the first packaging interval between the LED elements 30 packaged in the first packaging area 31. Next, as illustrated in FIGS. 6A and 6B, the LED elements 30 in close proximity to each other are electrically connected with the wire 33 and the wire 33 that comes from the LED element 30 adjacent to the outer circumference of the opening 21 is connected to the wire patterns 22A and 22B.

Figure 7A:
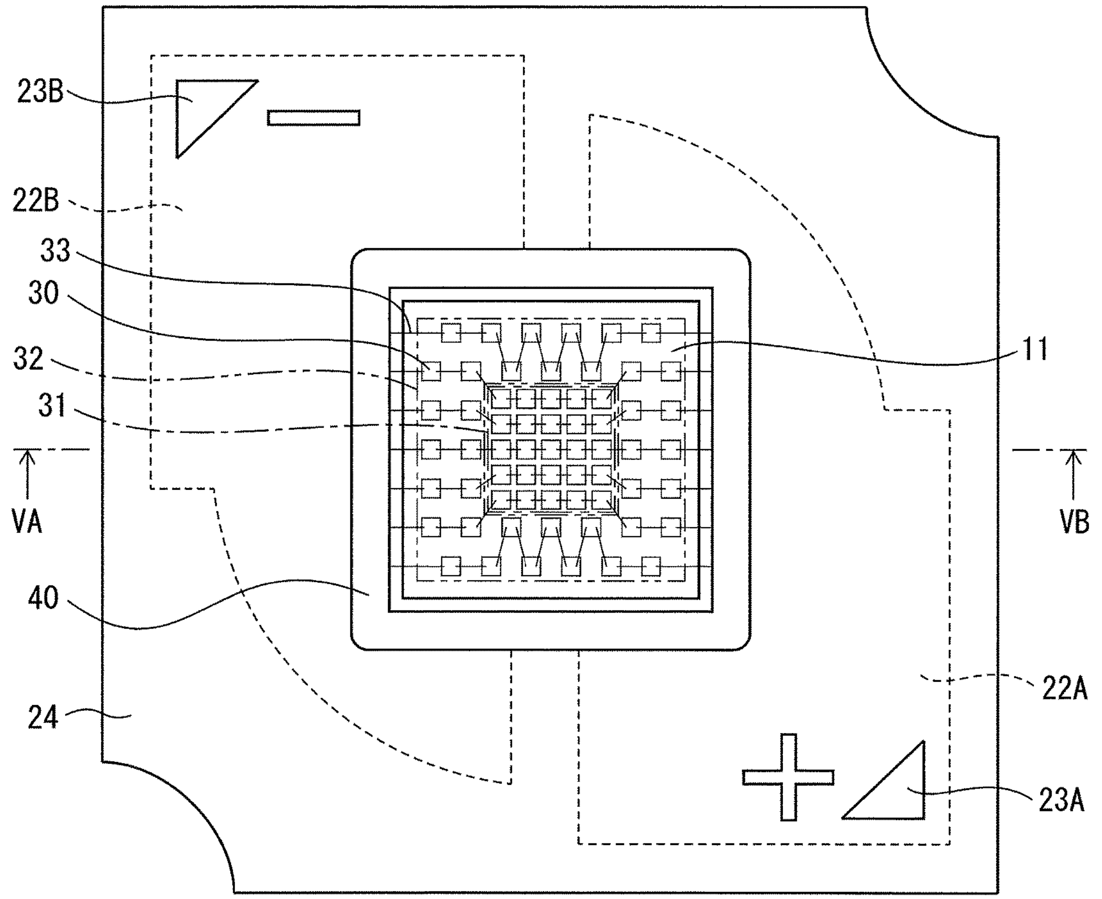
FIG. 7A is a plan view illustrating a fourth manufacturing process of the light-emitting apparatus illustrated in FIG. 1A.
Figure 7B:
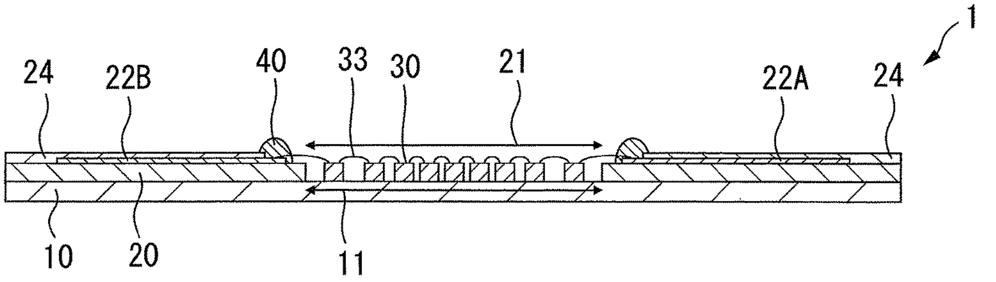
FIG. 7B is a section view corresponding to FIG. 7A.

Next, as illustrated in FIGS. 7A and 7B, the sealing frame 40 is fixed to the outer circumferential portion of the opening 21 on the top surface of the circuit substrate 20. Then, all of the LED elements 30 are sealed with the sealing resin 50 containing phosphors. The light-emitting apparatus 1 illustrated in FIGS. 1A and 1B is completed by the above process.

Operation and Effect of Light-Emitting Apparatus According to Embodiment

In the light-emitting apparatus 1, the first packaging interval between the LED elements 30 packaged in the first packaging area 31 including the center of the packaging area 11 is narrower than the second packaging interval between the LED elements 30 packaged in the second packaging area 32 surrounding the perimeter of the first packaging area 31. The light-emitting apparatus 1 increases the light emission intensity of the light-emitting apparatus by narrowing the packaging interval between the LED elements 30 packaged in the first packaging area 31 in close proximity to the center of the packaging area 11 to increase the number of LED elements 30 in close proximity to the optical axis of the lens. Further, the light-emitting apparatus 1 suppresses the total amount of generated heat of the light-emitting apparatus 1 by widening the packaging interval between the LED elements 30 packaged in the second packaging area 32 than the packaging interval between the LED elements 30 packaged in the first packaging area 31 to reduce the packaging density. The light-emitting apparatus 1 may have a high light-emission intensity and to suppress an increase in the amount of generated heat by narrowing the packaging interval between the LED elements 30 packaged in the first packaging area 31 than the packaging interval between the LED elements 30 packaged in the second packaging area 32 surrounding the perimeter of the first packaging area 31.

Further, in the light-emitting apparatus 1, the packaging substrate is formed by a metal substrate the thermal conductivity of which is high, and therefore the temperature in the light-emitting apparatus 1 is maintained comparatively uniform, even though the packaging interval between the LED elements 30 packaged in the first packaging area 31 is different from that of the LED elements 30 packaged in the second packaging area 32.

First Modification Example of Light-Emitting Apparatus According to Embodiment

In the light-emitting apparatus 1, the LED elements 30 packaged in the first packaging area 31 are packaged in the form of a lattice at the first packaging intervals, however all the packaging intervals between the LED elements 30 packaged in the first packaging area 31 and the second packaging area 32 may not be uniformed. In the light-emitting apparatus of the embodiment, the average interval between the LED elements 30 packaged in the first packaging area 31 is narrower than the average interval between the LED elements 30 packaged in the second packaging area 32 surrounding the perimeter of the first packaging area 31.

Figure 8:
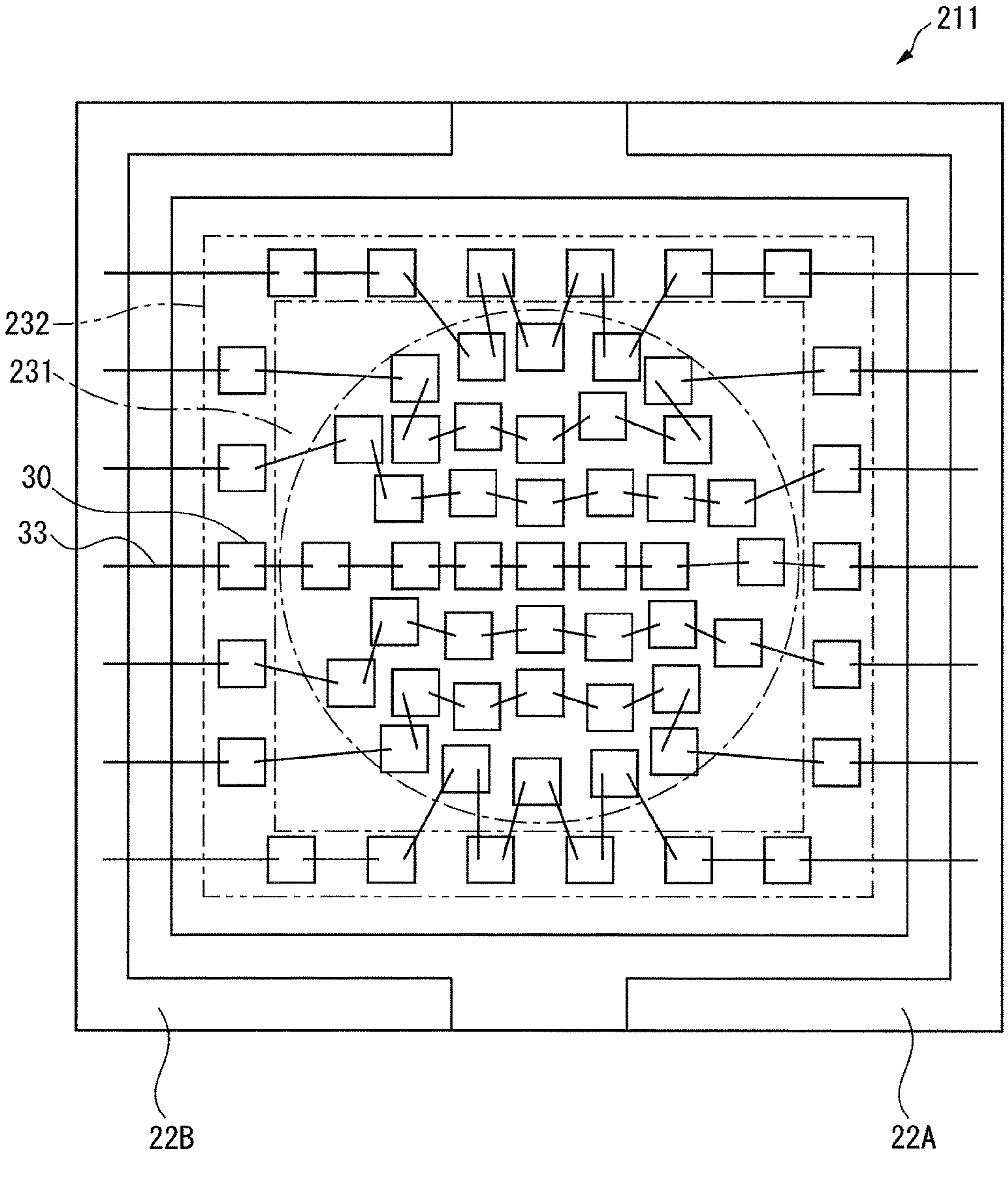
FIG. 8 is a partially enlarged plan view of a packaging area of a light-emitting apparatus according to a first modification example.

FIG. 8 is a partially enlarged plan view of a packaging area of a light-emitting apparatus according to a first modification example.

In the light-emitting apparatus according to the first modification example, the plurality of LED elements 30 is packaged in a packaging area 211 by being divided into the LED elements 30 packaged in a first packaging area 231 indicated by a one-dot chain line and the LED elements 30 packaged in a second packaging area 232 indicated by a two-dot chain line.

The LED elements 30 packaged in the first packaging area 231 are packaged by being arranged in order in the form of a circle in the area including the center of the packaging area 211. In the first packaging area 231, the 41 LED elements 30 are packaged. The LED elements 30 packaged in the second packaging area 232 are packaged on the outer edge of the packaging area 211 so as to surround the perimeter of the first packaging area 231. In the second packaging area 232, the 22 LED elements 30 are packaged.

Second Modification Example of Light-Emitting Apparatus According to Embodiment

In the light-emitting apparatus 1, the LED elements 30 are divided and packaged in the two packaging areas: the first packaging area and the second packaging area, but in the light-emitting apparatus of the embodiment, the LED elements 30 may be divided and arranged in three or more packaging areas. When the LED elements 30 are divided and arranged in three or more packaging areas, the LED elements 30 are packaged so that the packaging interval between the LED elements 30 included in the packaging area becomes wider as the packaging area becomes more distant from the center of the packaging area 11. Further, in the light-emitting apparatus of the embodiment, the LED elements 30 may be packaged, so that the packaging density of the LED element 30 becomes lower as the packaging area becomes more distant from the center of the packaging area 11.

Figure 9:
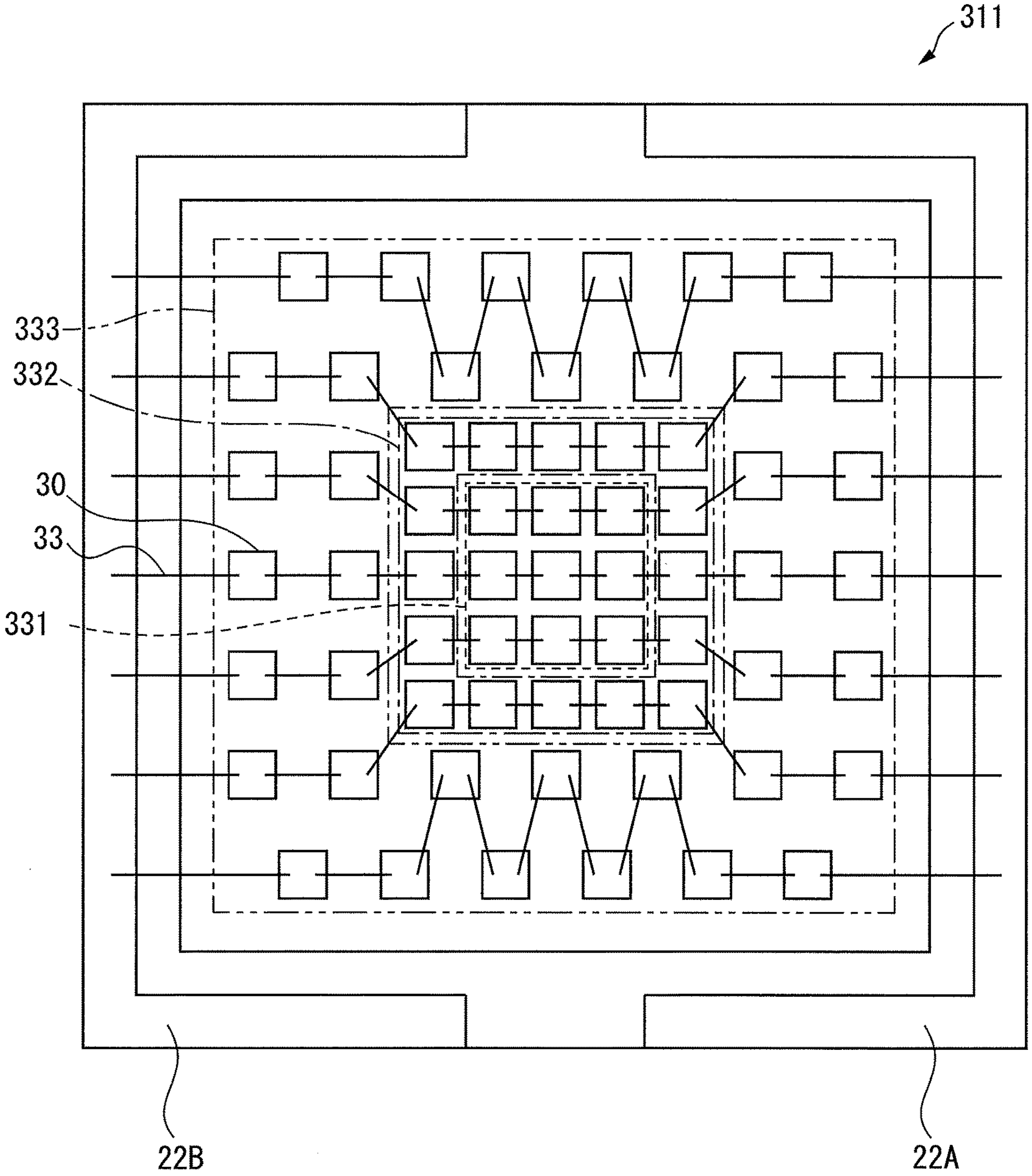
FIG. 9 is a partially enlarged plan view of a packaging area of a light-emitting apparatus according to a second modification example.

FIG. 9 is a partially enlarged plan view of a packaging area of a light-emitting apparatus according to a second modification example.

In the light-emitting apparatus according to the second modification example, the plurality of LED elements 30 is packaged in a packaging area 311 by being divided into those packaged in a first packaging area 331, those packaged in a second packaging area 332, and those packaged in a third packaging area 333. In FIG. 9, the first packaging area 331 is indicated by a broken line, the second packaging area 332 is indicated by a one-dot chain line, and the third packaging area 333 is indicated by a two-dot chain line.

The LED elements 30 packaged in the first packaging area 331 are packaged by being arranged in order in the form of a lattice at regular intervals in the area including the center of the packaging area 331. In the first packaging area 331, the nine LED elements 30 are packaged. The LED elements 30 packaged in the second packaging area 332 are packaged by being arranged in order at regular intervals so as to surround the perimeter of the first packaging area 331. In the second packaging area 332, the 16 LED elements 30 are packaged. The LED elements 30 packaged in the third packaging area 333 are packaged on the outer edge of the packaging area 311 so as to surround the perimeter of the second packaging area 332. In the third packaging area 333, the 22 LED elements 30 are packaged.

Third Modification Example of Light-Emitting Apparatus According to Embodiment

Figure 10:
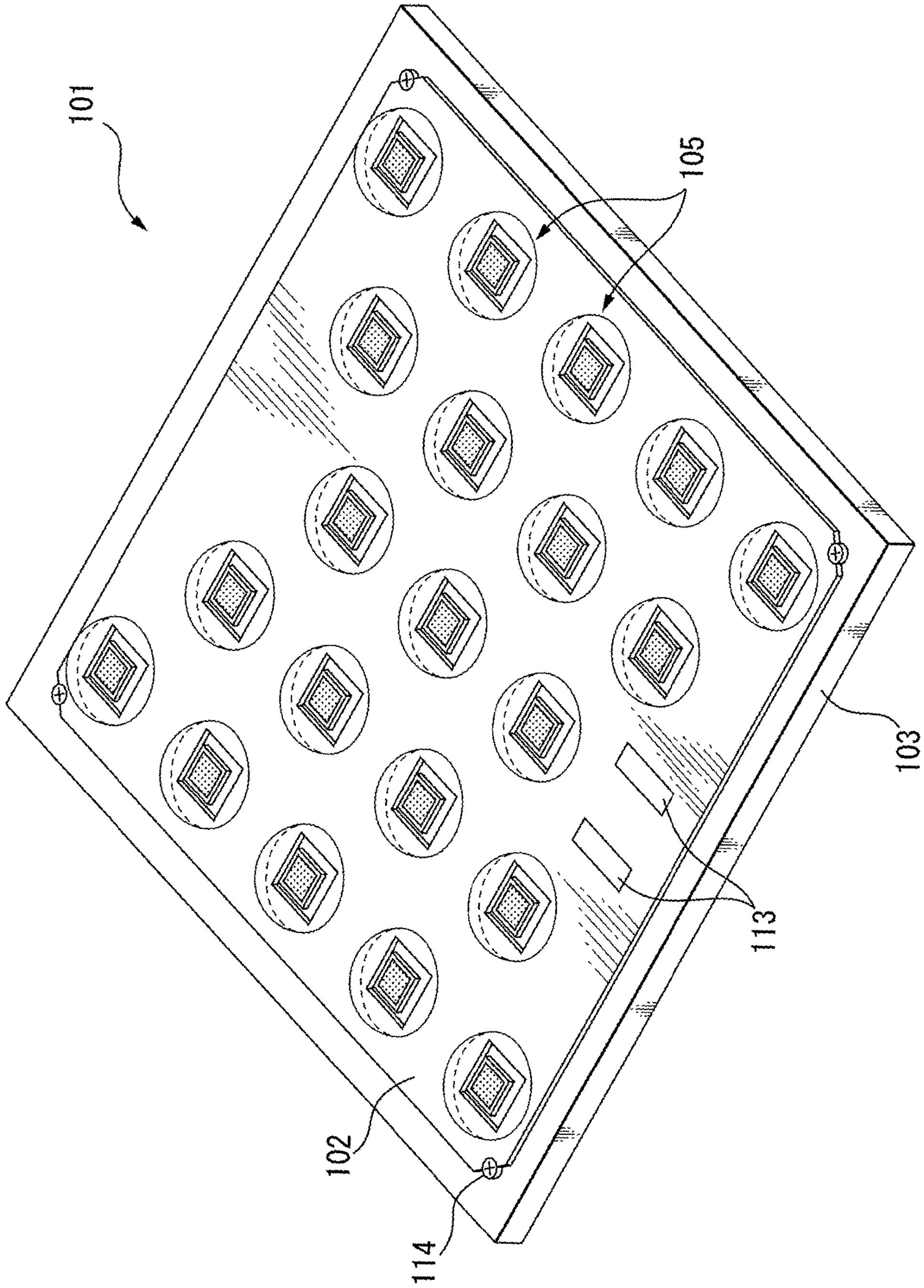
FIG. 10 is a perspective view of a modification example of a light-emitting apparatus to which a lens is attached.
Figure 11:
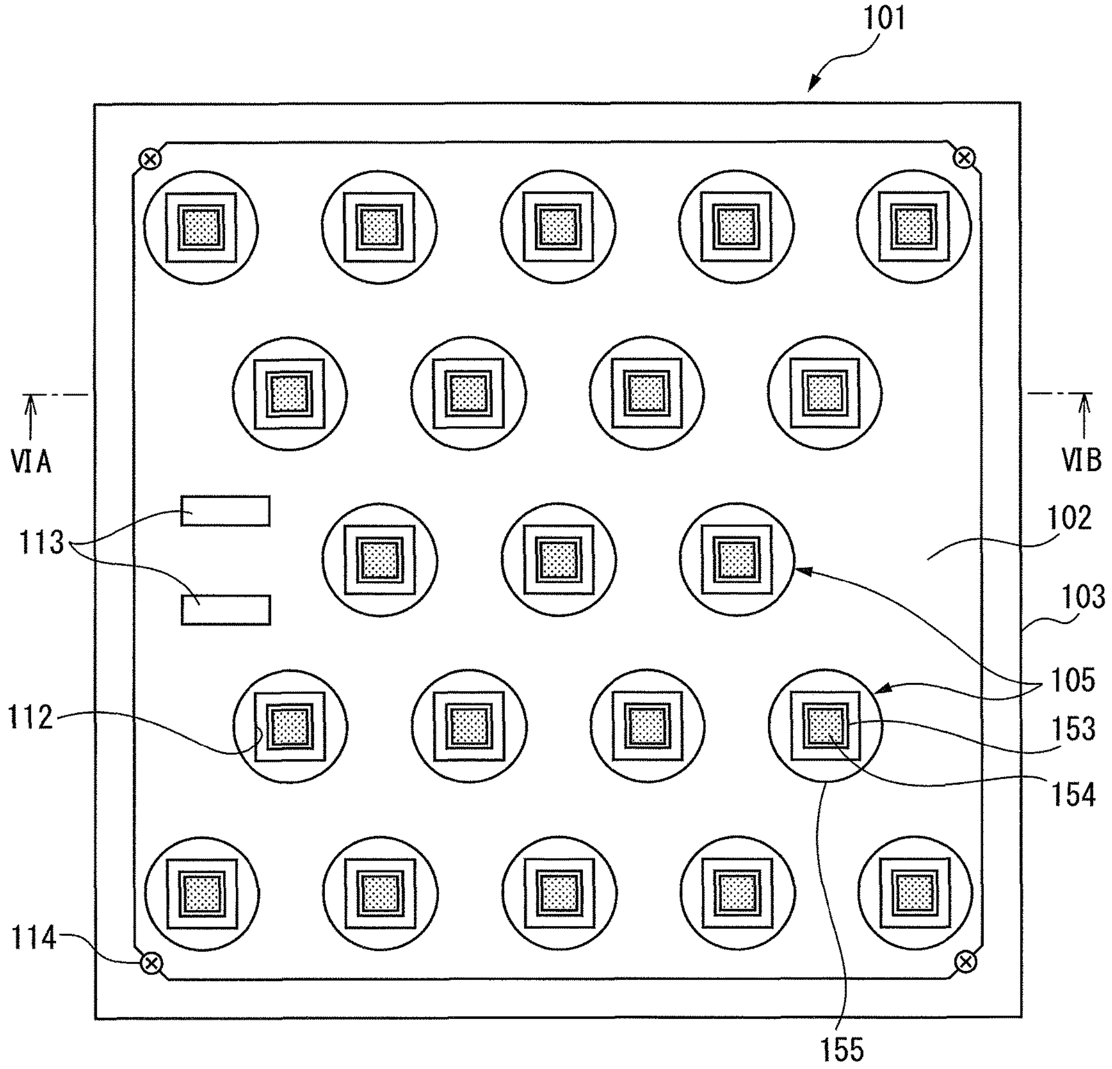
FIG. 11 is a plan view of a light-emitting apparatus illustrated in FIG. 10.
Figure 12:
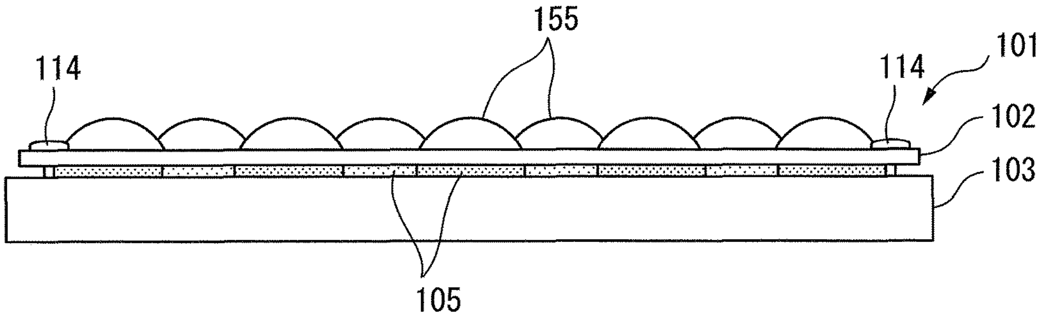
FIG. 12 is a side view of the light-emitting apparatus illustrated in FIG. 10.
Figure 13:
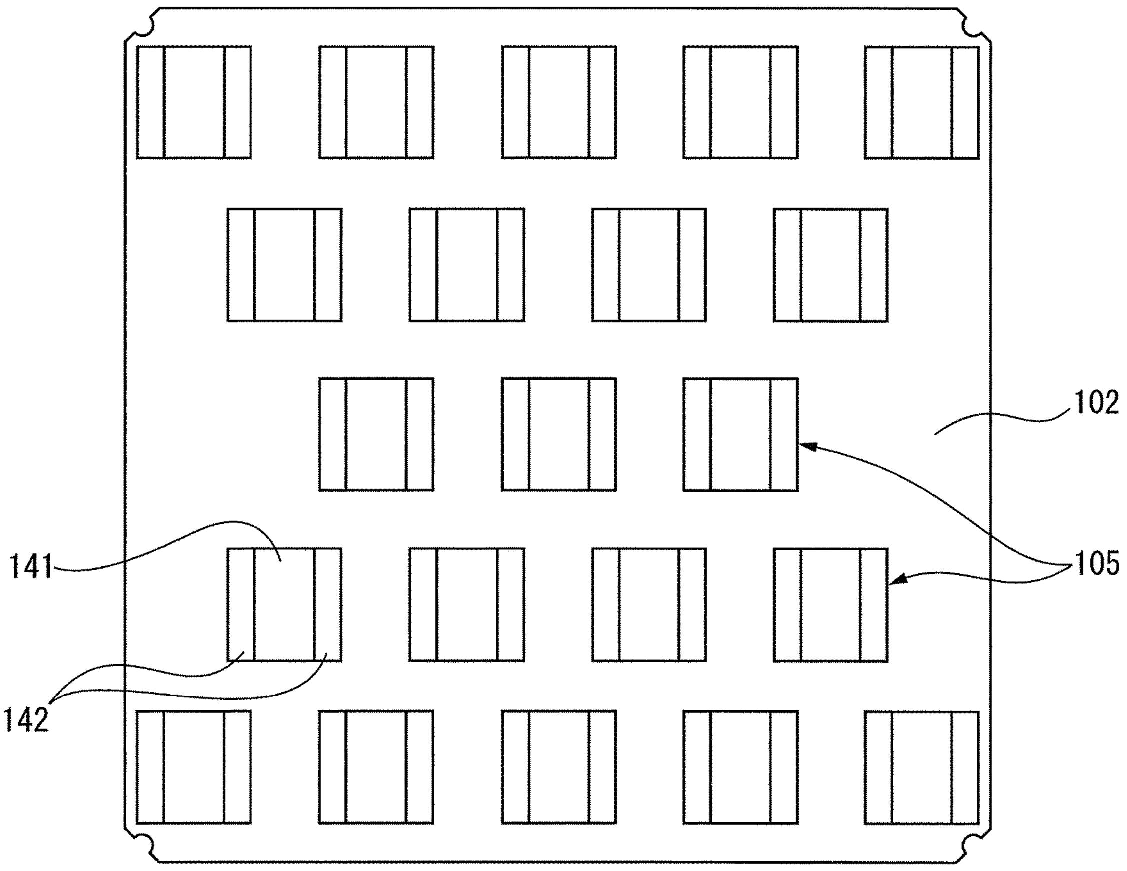
FIG. 13 is a back view of the light-emitting apparatus illustrated in FIG. 10 from which a heat dissipating substrate is removed.

FIG. 10 to FIG. 12 are a perspective view, a plan view, and a side view of a modification example of a light-emitting apparatus to which a lens is attached. A light-emitting apparatus 101 has a structure in which a plurality of LED packages 105 is packaged on the backside of a circuit substrate 102 and further a heat dissipating substrate 103 is arranged on the backsides of the plurality of LED packages 105. FIG. 13 is a back view of the light-emitting apparatus 101 from which the heat dissipating substrate 103 is removed. The light-emitting apparatus 101 has the 21 LED packages 105 as a light-emitting unit, which are used, for example, as an LED light source device for various kinds of illumination. However, the number of LED packages 105, i.e., 21, is an example and the number of LED packages 105 is not limited in particular and for example, may be one.

Figure 14:
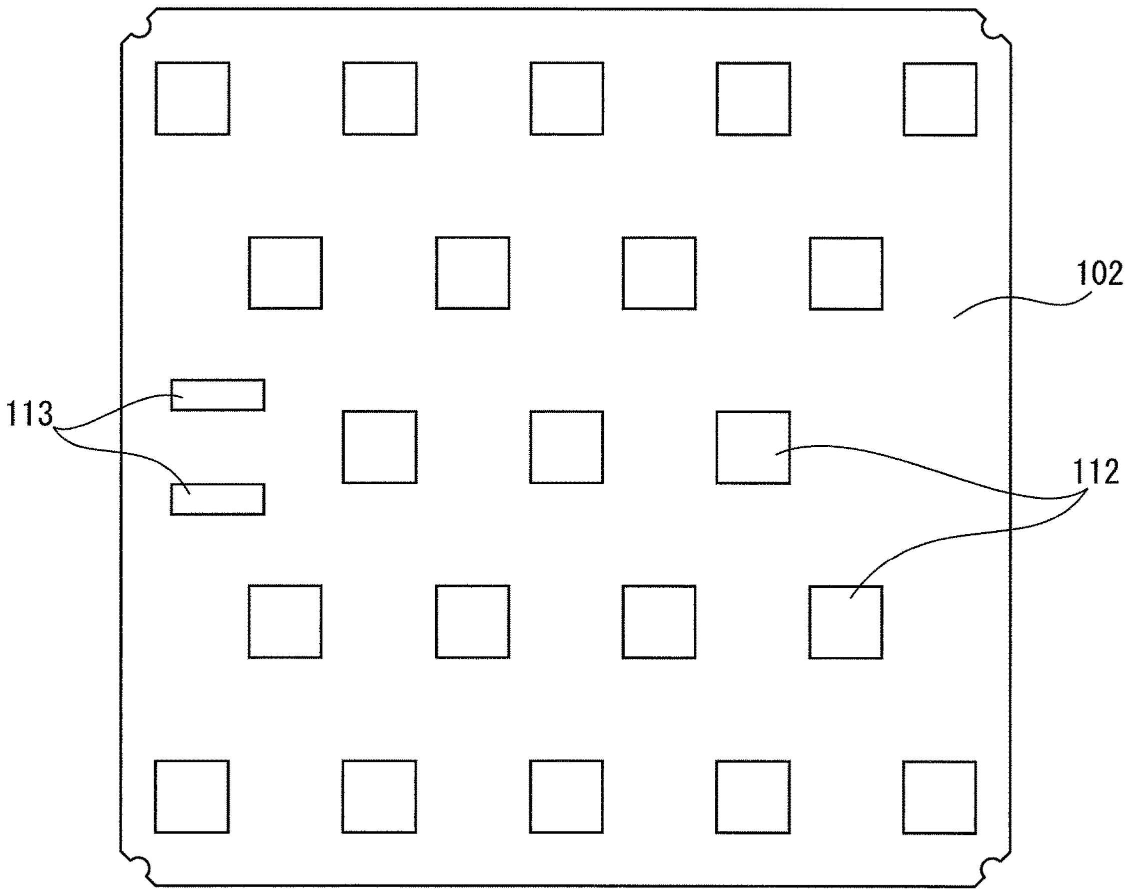
FIG. 14 is a top view of a circuit substrate illustrated in FIG. 10.

FIG. 14 is a top view of the circuit substrate 102. The circuit substrate 102 is a substantially rectangular insulating substrate configured by, for example, a glass epoxy substrate or the like. In the example illustrated schematically, 21 openings 112 for inserting the LED package 105 are formed at substantially regular intervals on the circuit substrate 102.

Although details are not illustrated schematically, on the circuit substrate 102 a wire pattern for electrically connecting the plurality of LED packages 105 to one another is formed. Further, at the left end of the circuit substrate 102 illustrated in FIG. 11 and FIG. 14, two electrodes 113 for connecting the light-emitting apparatus 101 to an external power source are attached. Each LED package 105 emits light by the electrodes 113 being connected to the external power source and being applied with a voltage. All the LED packages 105 of the light-emitting apparatus 101 may emit light at the same time, or only part of the LED packages 105 may emit light depending on the wire pattern on the circuit substrate 102.

The heat dissipating substrate 103 is a rectangular metal substrate arranged on the backside of the circuit substrate 102 so as to contact with the package substrates of the plurality of LED packages 105. Since the heat dissipating substrate 103 functions as a heat sink that dissipates heat generated in each LED package 105, the heat dissipating substrate 103 is configured by aluminum or copper which is excellent both in the heat resisting property and in the heat dissipating property. However, the material of the heat dissipating substrate 103 may be one other than aluminum and copper as long as it is excellent both in the heat resisting property and in the heat dissipating property. As illustrated in FIG. 10 to FIG. 12, both the circuit substrate 102 and the heat dissipating substrate 103 are fixed to each other by screws 114 in the four corners thereof.

Figure 15:
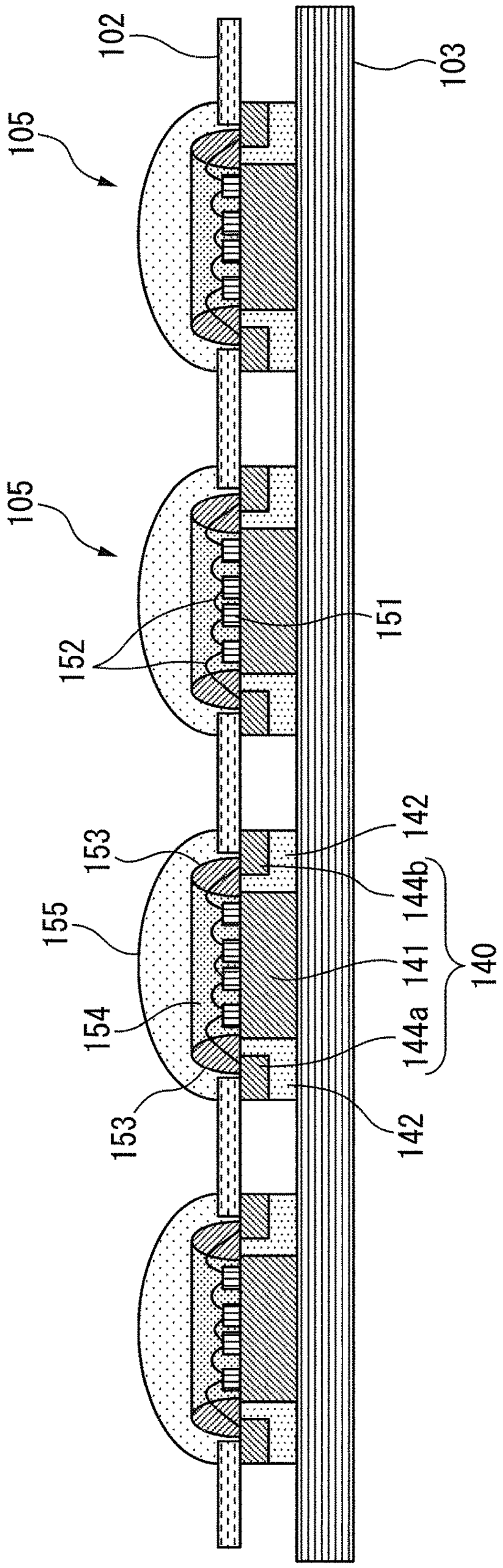
FIG. 15 is a section view of the light-emitting apparatus illustrated in FIG. 10 along VI-VI line in FIG. 11.

FIG. 15 is a section view of the light-emitting apparatus 101 along VI-VI line in FIG. 11. Each LED package 105 has a lead frame 140, an insulating resin 142, an LED element 151, a resin frame 153, a sealing resin 154, and a lens resin 155 and the portion above the lead frame 140 is inserted into the opening 112 from the backside of the circuit substrate 102. In each LED package 105, the end of the lead frame 140 is solder-connected to the backside of the circuit substrate 102.

The lead frame 140 includes a packaging part 141 on the top surface of which the LED element 151 is packaged and the backside of which contacts with the heat dissipating substrate 103, and electrode parts **144*a* and 144*b* the thickness of which is less than that of the packaging part 141 and which are electrically connected to the LED element 151 and the circuit substrate 102. Between the packaging part 141 and the electrode parts 144*a* and 144*b*, and between the electrode parts 144*a* and 144*b* and the heat dissipating substrate 103, the insulating resin 142 is filled so that they are electrically insulated from each other. In the electrode parts 144*a* and 144*b*, the side on the packaging part 141 side and the backside on the heat dissipating substrate 103 side are covered with the insulating resin 142, and therefore only the side on the opposite sided of the packaging part 141 and the top surface are exposed and the exposed top surface is connected to the wire pattern and a wire 152 of the circuit substrate 102**.

As explained with reference to FIG. 10 or the like, the LED elements 151 are packaged in the packaging part 141 by being divided into those in the first packaging area and those in the second packaging area. The LED elements 151 packaged in the first packaging area are arranged in order in the form of a lattice at regular intervals in the area including the center of the packaging part 141. A first packaging interval, which is the interval between the LED elements 151 packaged in the first packaging area, is narrower than 0.25 times the length of one side of the LED element 151.

The LED elements 151 packaged in the second packaging area are packaged on the outer edge of the packaging part 141 so as to surround the perimeter of the first packaging area. The LED elements 151 packaged in the second packaging area are packaged so that at least one of a packaging interval between the LED elements 151 adjacent to each other in the vertical direction and a packaging interval between the LED elements 151 adjacent to each other in the horizontal direction is the regular interval. A second packaging interval, which is the minimum interval between the LED elements 151 packaged in the second packaging area, is wider than 0.25 times the length of one side of the LED element 151. In other words, the second packaging interval between the LED elements 151 packaged in the second packaging area is wider than the first packaging interval between the LED elements 151 packaged in the first packaging area.

The undersurface of the LED element 151 is fixed to the top surface of the packaging part 141 with, for example, a transparent, insulating adhesive or the like. Further, the LED element 151 has a pair of element electrodes on its top surface and the element electrodes of the LED elements 151 adjacent to each other are electrically connected by the boding wire 152 (hereinafter, simply referred to as the wire 152). The wire 152 that comes out of the LED element 151 located at the end of the packaging unit 141 is connected to the electrode part **144*a* or the electrode part 144*b*. A current is supplied to each LED element 151 via the wire 152**.

The resin frame 153 is a rectangular frame body configured by, for example, a white resin and fixed onto the packaging part 141 and the electrode parts **144*a* and 144*b* across the insulating resin 142 exposed on the top surface of the lead frame 140. The resin frame 153 defines an area filled with the sealing resin 154 and is a dam material for preventing the outflow of the sealing resin 154, and reflects light emitted laterally from the LED element 151 toward above the LED package 105 (the top surface side of the circuit substrate 102**).

The shape of the resin frame 153 is not limited to a rectangle and may be, for example, a circle. However, when a large number of LED elements 151 are packaged highly densely, each LED element 151 may be arranged in the form of a rectangular lattice in the packaging area defined by the rectangular resin frame 153.

The sealing resin 154 is configured by, for example, a colorless transparent thermosetting resin including an epoxy resin or a silicone resin, and filled in the space over the packaging part 141 surrounded by the resin frame 153 and covers and protects (seals) the LED element 151 and the wire 152 as an integrated single unit. The sealing resin 154 may contain phosphors excited by the LED element 151. For example, when the LED element 151 is a blue LED, the sealing resin 154 may contain yellow phosphors including YAG (Yttrium Aluminum Garnet). The LED package 105 emits white light obtained by mixing blue light from the LED element 151 and yellow light obtained by exciting yellow phosphors with the blue light. Further, the sealing resin 154 may contain a plurality of kinds of phosphor including the yellow phosphor and the red phosphor or may contain a different kind of phosphor for each LED package 105.

In the LED package 105 of the light-emitting apparatus 101, the backside of the packaging part 141 in which the LED element 151 is packaged is in direct contact with the heat dissipating substrate 103, and therefore the heat dissipating property is improved compared to that of a conventional LED package. A large heat-generating element may be easily designed, and the number of LED elements packaged in each LED package may be increased, compared to a conventional LED package.

On the backside of the LED package 105, the packaging part 141 is exposed but the electrode parts 144*a* and 144*b* are not exposed. In the LED package 105, since the insulating resin 142 is interposed between the electrode parts 144*a* and 144*b*, and the heat dissipating substrate 103, the distance between the circuit substrate 102 and the heat dissipating substrate 103 becomes greater compared to that of a conventional LED package, and therefore the electrical insulating property is improved.

Further, unlike a conventional LED package, in the light-emitting apparatus 101, a planar area is formed on the circuit substrate 102, and therefore the degree of freedom in design is increased, and therefore the lens resin 155 may be larger or smaller. Furthermore, for the lead frame 140 of the LED package 105, the same metal substrate may be used as that of a surface-mounted LED package, and therefore the product may be provided at a lower cost.

What is claimed is:

1. A light-emitting apparatus comprising:

a packaging substrate having a packaging area;

a first electrical conduction pattern and a second electrical conduction pattern arranged along the periphery of the packaging area;

a first element group having a plurality of light-emitting elements;

a second element group having a plurality of light-emitting elements;

a third element group having a plurality of light-emitting elements;

a sealing resin that seals at least the first element group, the second element group and the third element group, and a lens on the packaging substrate, wherein the first element group, the second element group and the third element group are connected in parallel between the first electrical conduction pattern and the second electrical conduction pattern, the packaging area includes a first packaging area including central portion of the packaging area and a second packaging area surrounding about the first packaging area, the first element group includes a first portion arranged in the first packaging area, a second portion arranged in the second packaging area, and a third portion arranged in second packaging area, the plurality of light-emitting elements in the first portion, the second portion and the third portion are series-connected to each other, the second element group includes a fourth portion connected with the first electrical conduction pattern in the second packaging area, a fifth portion connected with the second electrical conduction pattern in second packaging area, and a sixth portion connected in zigzags between the fourth portion and the fifth portion, the plurality of light-emitting elements in the fourth portion, the fifth portion and the sixth portion are series-connected to each other, the third element group includes a seventh portion connected with the first electrical conduction pattern in the second packaging area, an eighth portion connected with the second electrical conduction pattern in second packaging area, and a ninth portion connected in zigzags between the seventh portion and the eighth portion, the plurality of light-emitting elements in the seventh portion, the eighth portion and the eighth portion are series-connected to each other, the packaging interval of the plurality of light-emitting elements in the first portion is shorter than the packaging intervals of plurality of light-emitting elements in the second portion, third portion, the fourth portion, the fifth portion, the sixth portion, the seventh portion, the eighth portion and the ninth portion, the optical axis of the lens substantially coincides with the center of the packaging area, the packaging interval of the plurality of light-emitting elements in the first packaging area is narrower than 0.25 times the length of one side of the light-emitting elements, the packaging interval of the plurality of light-emitting elements in the second packaging area is wider than 0.25 times the length of one side of the light-emitting elements, and the packaging interval of the plurality of light-emitting elements in the first packaging area is equal or wider than 5 μm and equal or narrower than 50 μm.

2. The light-emitting apparatus according to claim 1, wherein each of the light-emitting elements packaged in the first packaging area is arranged in the form of a lattice so that the interval between light-emitting elements adjacent to each other is a first interval, and each of the light-emitting elements packaged in the second packaging area is arranged so that the interval between light-emitting elements adjacent to each other is a second interval wider than the first interval.

3. The light-emitting apparatus according to claim 1, wherein the packaging substrate is a metal substrate.

4. The light-emitting apparatus according to claim 1, further comprising:

an optical element that is mounted on the packaging substrate so as to cover the sealing resin and which collects light emitted from the plurality of light-emitting elements.

* * * * *